(12) United States Patent
Delsaut et al.

(10) Patent No.: US 9,739,991 B2
(45) Date of Patent: Aug. 22, 2017

(54) LIGHT-CONCENTRATING LENS ASSEMBLY FOR A SOLAR ENERGY RECOVERY SYSTEM

(71) Applicants: James Delsaut, Sudbury (CA); Gilles Leduc, Sudbury (CA); Kelsey Leduc, Sudbury (CA)

(72) Inventors: James Delsaut, Sudbury (CA); Gilles Leduc, Sudbury (CA); Kelsey Leduc, Sudbury (CA); Malik Amjad, Redmond, WA (US)

(73) Assignee: 1930106 Ontario Limited, Sudbury, Ontario (CA)

( * ) Notice: Subject to any disclaimer, the term of this patent is extended or adjusted under 35 U.S.C. 154(b) by 152 days.

(21) Appl. No.: 14/771,151

(22) PCT Filed: Feb. 27, 2014

(86) PCT No.: PCT/CA2014/050136
§ 371 (c)(1),
(2) Date: Aug. 27, 2015

(87) PCT Pub. No.: WO2014/131124
PCT Pub. Date: Sep. 4, 2014

(65) Prior Publication Data
US 2016/0004055 A1    Jan. 7, 2016

Related U.S. Application Data

(60) Provisional application No. 61/770,373, filed on Feb. 28, 2013, provisional application No. 61/942,924, filed on Feb. 21, 2014.

(51) Int. Cl.
G02B 19/00    (2006.01)
F24J 2/10    (2006.01)
(Continued)

(52) U.S. Cl.
CPC ............ *G02B 19/0023* (2013.01); *F24J 2/06* (2013.01); *F24J 2/10* (2013.01); *F24J 2/1047* (2013.01);
(Continued)

(58) Field of Classification Search
CPC .... G02B 19/0023; G02B 19/0042; F24J 2/10; F24J 2/1047; F24J 2/12; F24J 2/15; F24J 2/18
(Continued)

(56) References Cited

U.S. PATENT DOCUMENTS 3,923,381 A    12/1975 Winston
4,002,499 A    1/1977 Winton
(Continued)

FOREIGN PATENT DOCUMENTS

| WO | 2008131561 | 11/2008 |
|----|------------|---------|
| WO | 2010/108969 | 9/2010 |
| WO | 2012021471 | 2/2012 |

OTHER PUBLICATIONS

European Patent Office, "Supplementary European Search Report," issued in European Application No. EP 14757728.2, by European Searching Authority, dated Sep. 1, 2016, document of 4 pages.
(Continued)

*Primary Examiner* — Ricky D Shafer
(74) *Attorney, Agent, or Firm* — Akerman LLP; Peter A. Chiabotti

(57) ABSTRACT

A light-concentrating lens assembly for a solar energy system, the assembly comprising a plurality of concentrically arranged paraboloid mirror reflectors, a conical light guide extending below the plurality of paraboloid mirror reflectors, an inner central cone disposed along a central axis
(Continued)

of the concentrically arranged paraboloid mirror reflectors, and a compound paraboloid concentrator disposed beneath the inner central cone.

24 Claims, 15 Drawing Sheets

(51) Int. Cl.
| | | |
|---|---|---|
| *F24J 2/12* | (2006.01) | |
| *F24J 2/15* | (2006.01) | |
| *H01L 31/054* | (2014.01) | |
| *F24J 2/06* | (2006.01) | |
| *F24J 2/18* | (2006.01) | |

(52) U.S. Cl.
CPC . *F24J 2/12* (2013.01); *F24J 2/15* (2013.01); *F24J 2/18* (2013.01); *G02B 19/0042* (2013.01); *H01L 31/0547* (2014.12); *F24J 2002/1095* (2013.01); *Y02E 10/44* (2013.01); *Y02E 10/52* (2013.01)

(58) Field of Classification Search
USPC .......................... 359/853; 126/684, 685, 690
See application file for complete search history.

(56) References Cited

U.S. PATENT DOCUMENTS

| | | | |
|---|---|---|---|
| 4,003,638 A | 1/1977 | Winton | |
| 4,171,695 A * | 10/1979 | Sletten | F24J 2/06 126/634 |
| 6,384,320 B1 * | 5/2002 | Chen | F24J 2/085 126/643 |
| 6,620,995 B2 | 9/2003 | Vasylyev et al. | |
| 8,794,229 B2 * | 8/2014 | Shi | G02B 5/10 126/684 |
| 9,086,227 B2 * | 7/2015 | Wang | F24J 2/06 |
| 2002/0139414 A1 | 10/2002 | Vasylyev et al. | |
| 2008/0000516 A1 | 1/2008 | Shifman | |

OTHER PUBLICATIONS

Patent Cooperation Treaty, "International Search Report," issued in International Application No. PCT/CA2014/050136, by Canadian Searching Authority, dated May 13, 2014.

Rabl, "Comparison of Solar Concentrarors," Solar Energy, vol. 18, pp. 93-111, Apr. 23, 1975.

* cited by examiner

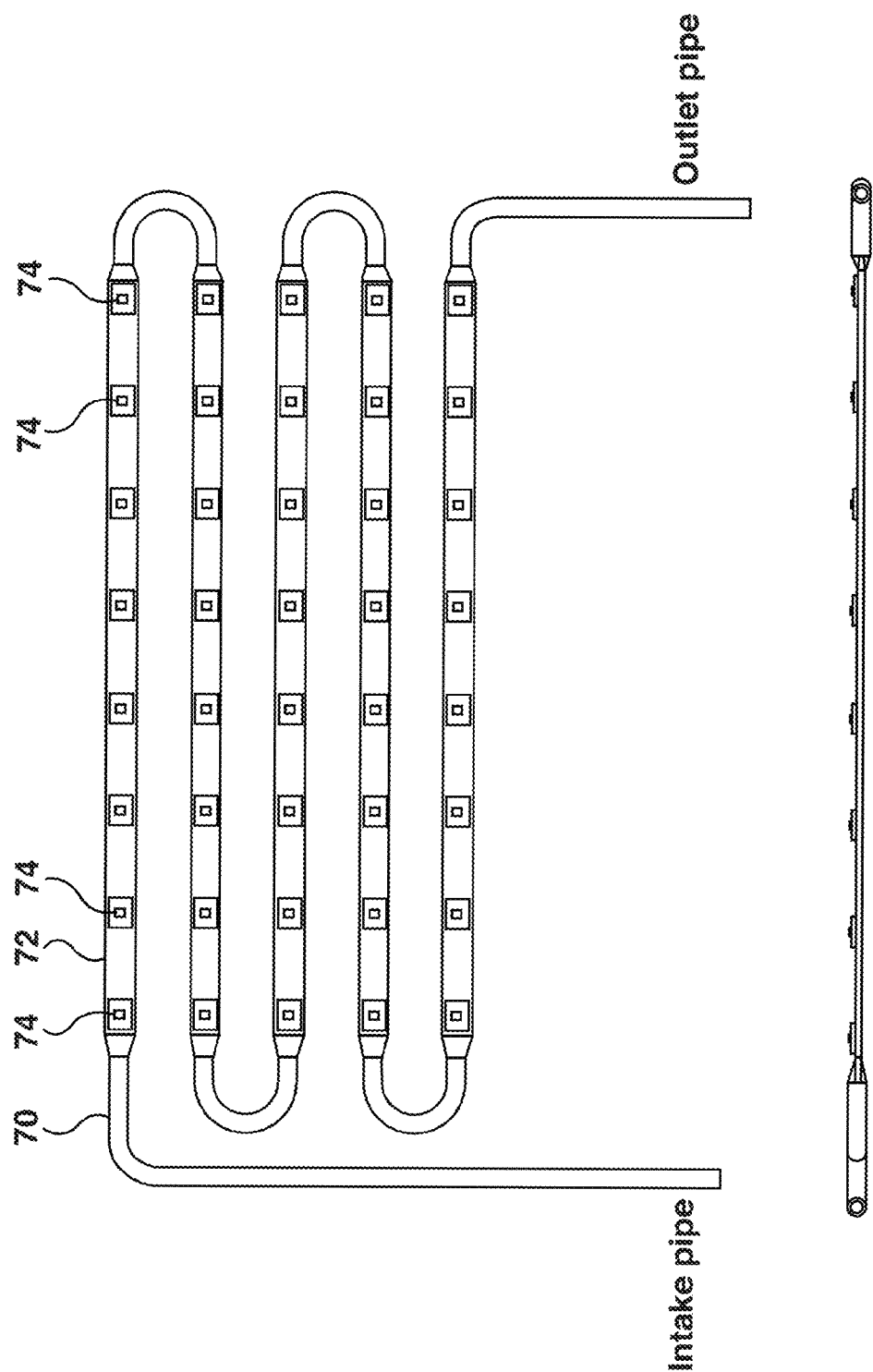

US 9,739,991 B2

LIGHT-CONCENTRATING LENS ASSEMBLY FOR A SOLAR ENERGY RECOVERY SYSTEM

TECHNICAL FIELD

The present technology relates generally to solar energy and, in particular, to lenses and concentrators for solar energy systems.

BACKGROUND

Solar concentrators are devices that augment the efficiency of solar power by concentrating sun rays using parabolic mirrors or a fresnel lens. A good review of solar concentrators is presented by Ari Rabl in "Comparison of Solar Concentrators", *Solar Energy*, Vol. 18, pp. 93-111.

With the increasing importance of solar energy, further improvements and enhancements in solar concentrator technology remain highly desirable.

SUMMARY

An inventive aspect of the disclosure is a light-concentrating lens assembly for a solar energy system, the assembly comprising a plurality of concentrically arranged paraboloid mirror reflectors, a conical light guide extending below the plurality of paraboloid mirror reflectors, an inner central cone disposed along a central axis of the concentrically arranged paraboloid mirror reflectors, and a compound paraboloid concentrator disposed beneath the inner central cone.

Another inventive aspect of the disclosure is a light-concentrating lens assembly for a solar energy system, the assembly comprising two concentrically arranged spherical and conical mirrors, a central lens to collect flux, a central reflective cone disposed along a central axis of the concentrically arranged spherical and conical mirrors to redirect flux from the mirrors, a compound paraboloid concentrator (CPC) disposed beneath the central reflective cone, and a small negative lens having a diameter substantially equal to an exit aperture of the CPC. Although the light-concentrating lens assembly illustrated in the figures and described herein may have a central lens 55 on top and a small negative lens 57 beneath and within the central reflective cone 54, the small negative lens 57 may be omitted or, alternatively, both the small negative lens 57 and the central lens 55 may be omitted.

Other aspects of the present invention are described below in relation to the accompanying drawings.

BRIEF DESCRIPTION OF THE DRAWINGS

Further features and advantages of the present technology will become apparent from the following detailed description, taken in combination with the appended drawings, in which:

FIG. 14 depicts one example of a heat exchanger for a solar energy system into which a plurality of the novel lenses may be integrated;

It will be noted that throughout the appended drawings, like features are identified by like reference numerals.

DETAILED DESCRIPTION

Figure 1:
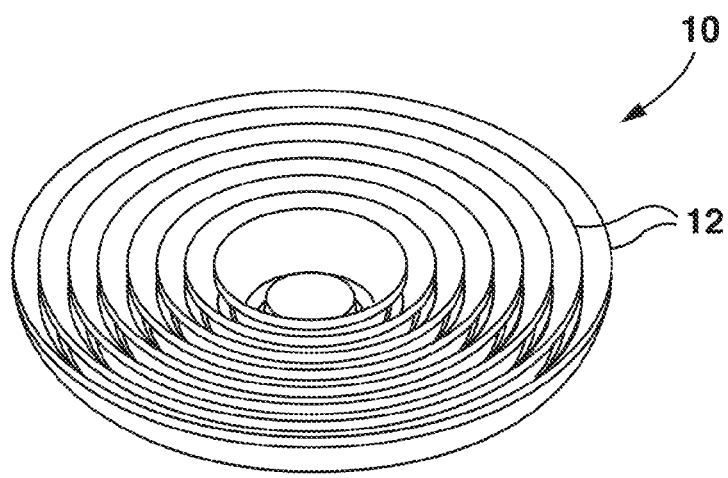
FIG. 1 is an isometric view of a light-concentrating lens assembly in accordance with an embodiment of the present invention.
Figure 2:
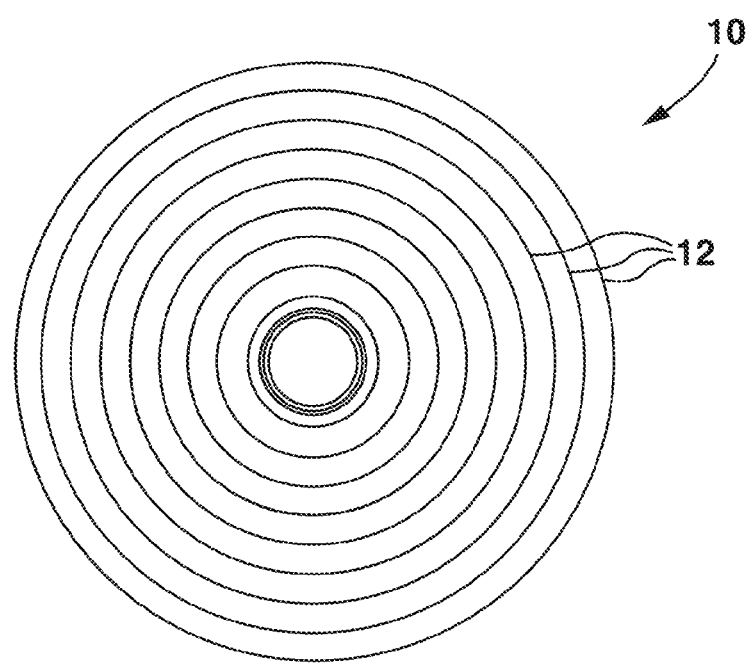
FIG. 2 is a top view of light-concentrating lens assembly depicted in FIG. 1.
Figure 3:
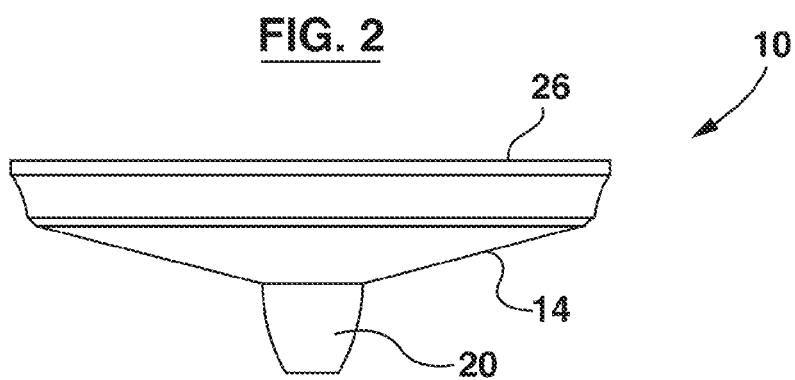
FIG. 3 is a side view of the light-concentrating lens assembly depicted in FIG. 1.
Figure 4:
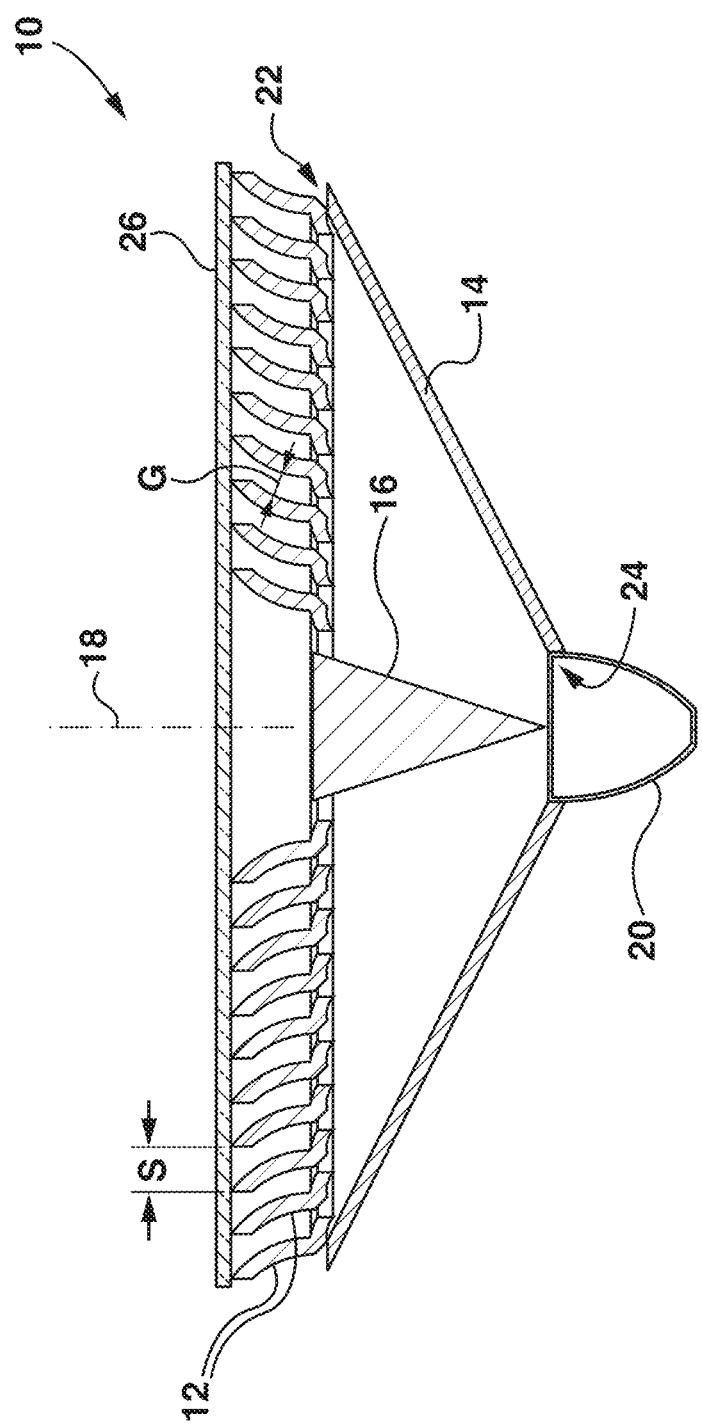
FIG. 4 is a cross-sectional side view of the light-concentrating lens assembly of FIG. 1.

FIGS. 1-5 depict a light-concentrating lens assembly for a solar energy system in accordance with an embodiment of the present invention. The light-concentrating lens assembly may be used with any suitable solar energy system including a hybrid solar energy system.

In general, the light-concentrating lens assembly, which is generally designated by reference numeral 10, comprises a plurality of concentrically arranged paraboloid mirror reflectors 12, a conical light guide 14 extending below the plurality of paraboloid mirror reflectors, a reflective inner central cone 16 disposed along a central axis 18 of the concentrically arranged paraboloid mirror reflectors, and a compound paraboloid concentrator 20 disposed beneath the inner central cone. The compound paraboloid concentrator (CPC) is also known as a Winston cone. The Winston cone is described and illustrated in U.S. Pat. No. 3,923,381, U.S. Pat. No. 4,003,638 and U.S. Pat. No. 4,002,499, which are all hereby incorporated by reference. The publication by Ari Rabl in "Comparison of Solar Concentrators", *Solar Energy*, Vol. 18, pp. 93-111 is also hereby incorporated by reference.

In the embodiment illustrated in the figures, the conical light guide 14 has a reflective coating and extends from a bottom 22 of a most radially outward reflector to an upper periphery 24 of the compound paraboloid concentrator.

In the embodiment illustrated in the figures, the light-concentrating lens assembly 10 includes a top glass plate 26 disposed on top of the plurality of concentrically arranged paraboloid mirror reflectors. This glass plate 26 may be coated with a reflective coating on the underside to fully capture all light that passes initially through the glass plate. In one specific embodiment, a thickness of the top glass plate is substantially equal to a thickness of each reflector. The thickness of the top glass plate may vary in a range equal to 90-110% of a thickness of each reflector. Persons of ordinary skill will recognize that other glass thicknesses may be employed. The top glass plate may be replaced with other suitable materials that permit incident light to enter the lens assembly.

In the embodiment illustrated in the figures, a gap G between successive paraboloid mirror reflectors is greater than a thickness t of each of the paraboloid mirrors reflectors. The ratio of the gap (G) between successive paraboloid mirror reflectors to the thickness (t) of each of the paraboloid mirror reflectors (G/t) may be between 1 and 2. The reflectors in the illustrated embodiment are equidistantly spaced (i.e. the gap between successive reflectors is constant). However, in other embodiments, the gap may be variable.

In the embodiment illustrated in the figures, the reflective inner cone 16 is longer than the compound paraboloid concentrator 20. The reflective inner cone 16, as shown by way of example, has a base diameter (D) equal to that of the compound paraboloid concentrator. As further illustrated, the compound paraboloid concentrator has a length equal to its base diameter. The base (upper surface) of the cone 16 may support a structure such as a pyramidal or conical structure which may have a reflective surface to reflect rays into the lens assembly. The central zone above the cone 16 may also be used to house circuitry.

In a specific embodiment, as illustrated in the figures, the inner cone has a length (L) to base diameter (D) ratio (L/D) of 8 to 5.

A ratio of a base diameter (D) of the inner cone to a diameter (d) of the top glass plate (D/d) ranges between 1:7 and 1:8. In the embodiment specifically illustrated, the ratio of the base diameter (D) of the inner cone to the diameter (d) of the top glass plate (D/d) is 1 to 7.6.

Figure 5:
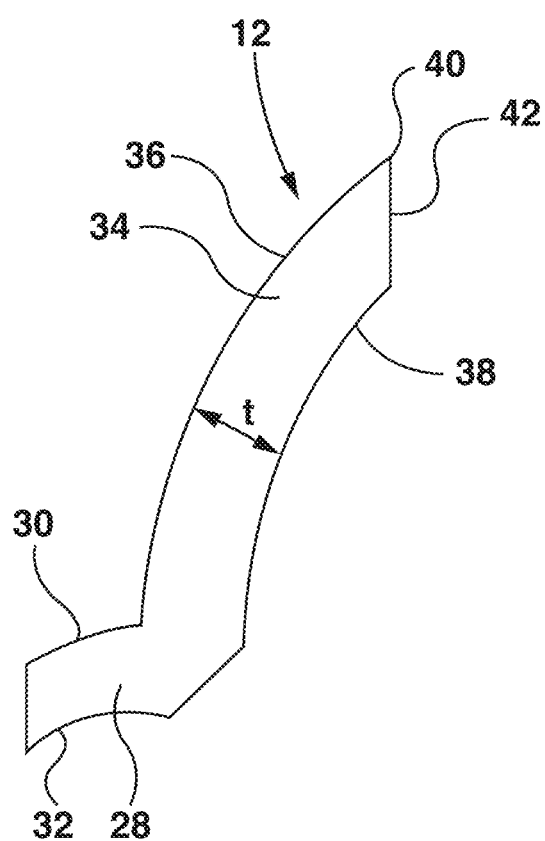
FIG. 5 is a cross-sectional view of the lens profile of the paraboloid mirror reflectors used in the light-concentrating lens assembly of FIG. 1.

As shown in FIG. 5, each reflector 12 has a lens profile characterized by a lower curved lens portion 28 having an upwardly facing convex surface 30 and a downwardly facing concave surface 32 and an upper curved upper lens portion 34 having a radially outward convex surface 36 and a radially inward concave surface 38. Specifically, the upper curved lens portion 34 may terminate in an upper circular edge 40 as shown in the figures. A spacing (S) between each successive upper circular edge may be equal to three times a thickness of each reflector or this spacing between each successive upper circular edge may range from two to four times a thickness of each reflector. It is further noted that the spacing (S) is greater than the gap (G). It is further noted in the illustrated embodiment that there is a flattened face 42 that is substantially parallel to the axis 18.

In the specific embodiment illustrated in the figures, the inner central cone 16 has a highly reflective coating to ensure that all light that passes through the reflectors 12 into the light guide 14 travels into the CPC 20.

The concentrator assembly (or lens assembly) 10 may work in conjunction with a heat exchanger for dissipating some of the heat produced by the concentrated solar energy. The heat exchanger, which may be placed below assembly 10, for example below the exit aperture of the Winston cone, increases the efficiency of the concentrator assembly by keeping the temperature of the assembly within a desired temperature range. This concentrator may thus be used with a solar energy recovery system. This concentrator may be particularly useful in conjunction with a hybrid solar energy recovery system. Such a system comprises a frame, a heat exchanger plate disposed above the frame, and a dual-purpose solar energy recovery plate mounted to the frame. The dual-purpose plate has a plurality of light-concentrating lenses for concentrating incident solar radiation onto the heat exchanger plate to recover thermal energy and a plurality of photovoltaic cells for generating an electric current in response to solar radiation incident on the photovoltaic cells.

The specific dimensions of the light-concentrating lens assembly shown in the figures relate to one specific design. As will be appreciated by those skilled in optics, these dimensions may be varied to achieve different size and/or performance requirements.

Figure 7:
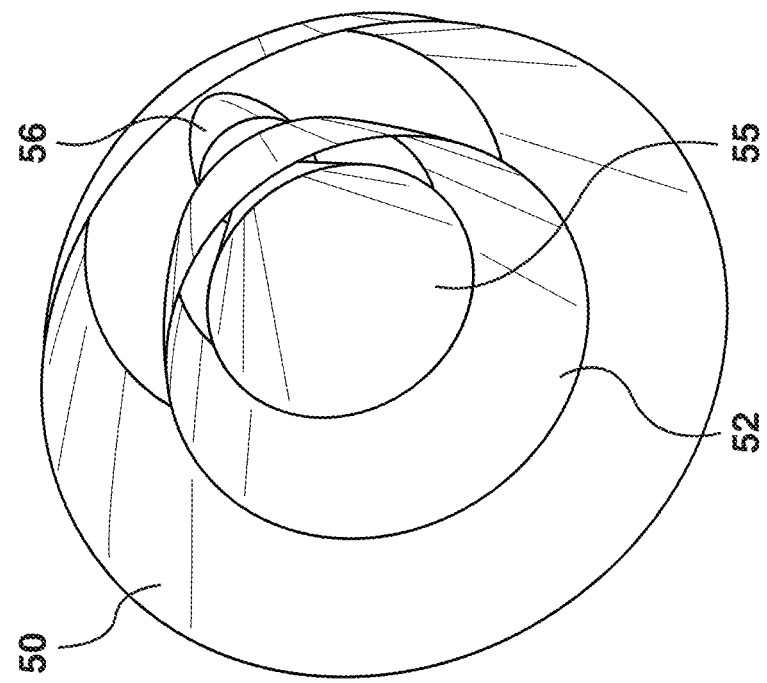
FIG. 7 is a front isometric view of a light-concentrating lens assembly in accordance with another embodiment of the present invention.
Figure 6:
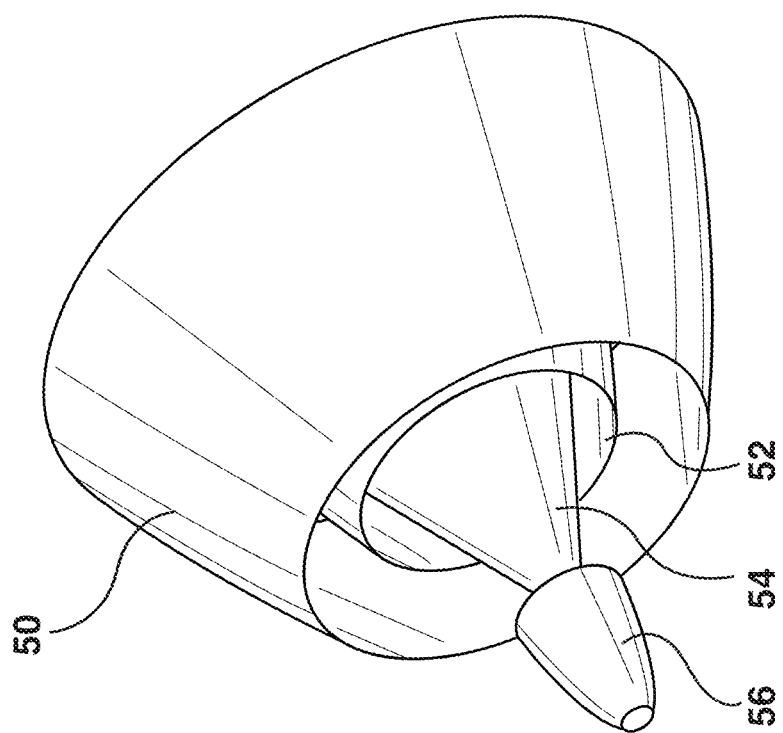
FIG. 6 is a rear isometric view of a light-concentrating lens assembly in accordance with another embodiment of the present invention.
Figure 8:
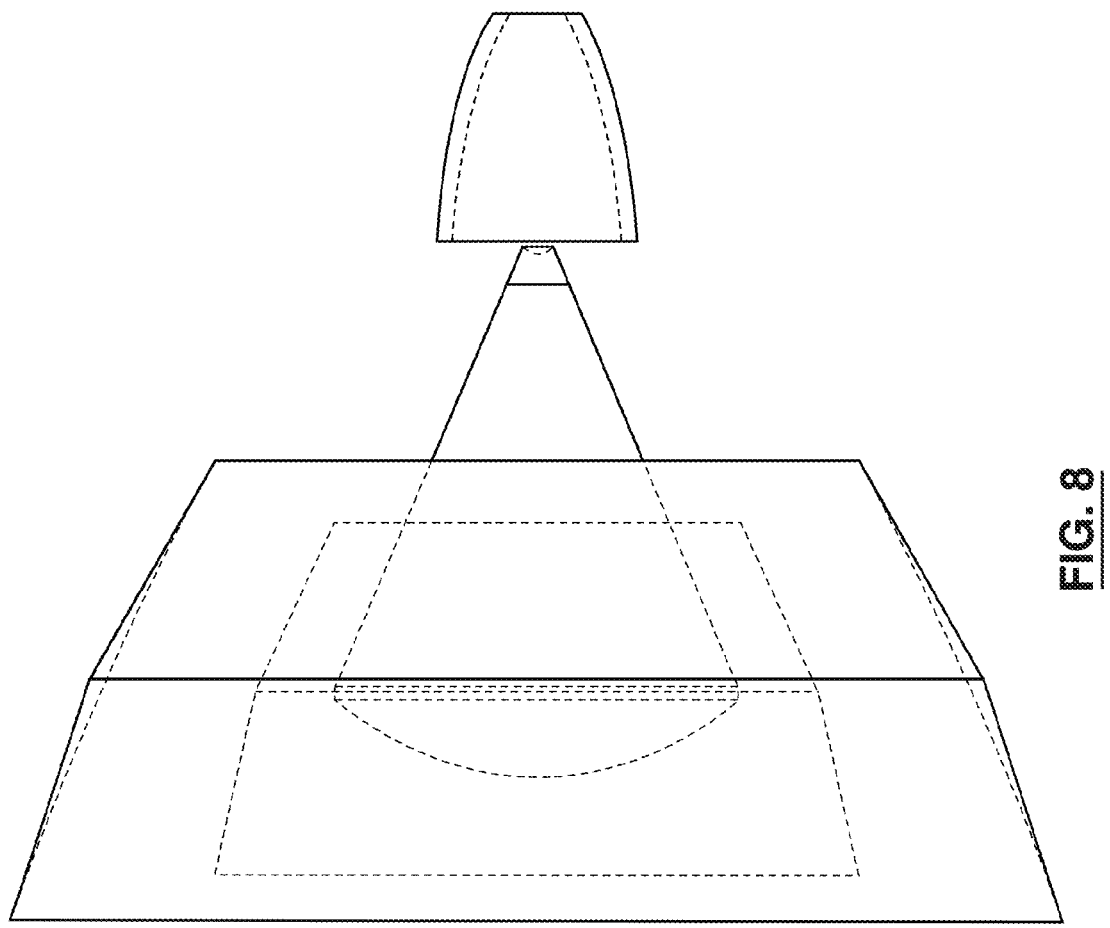
FIG. 8 is a cross-sectional view of a light-concentrating lens assembly in accordance with another embodiment of the present invention.
Figure 9:
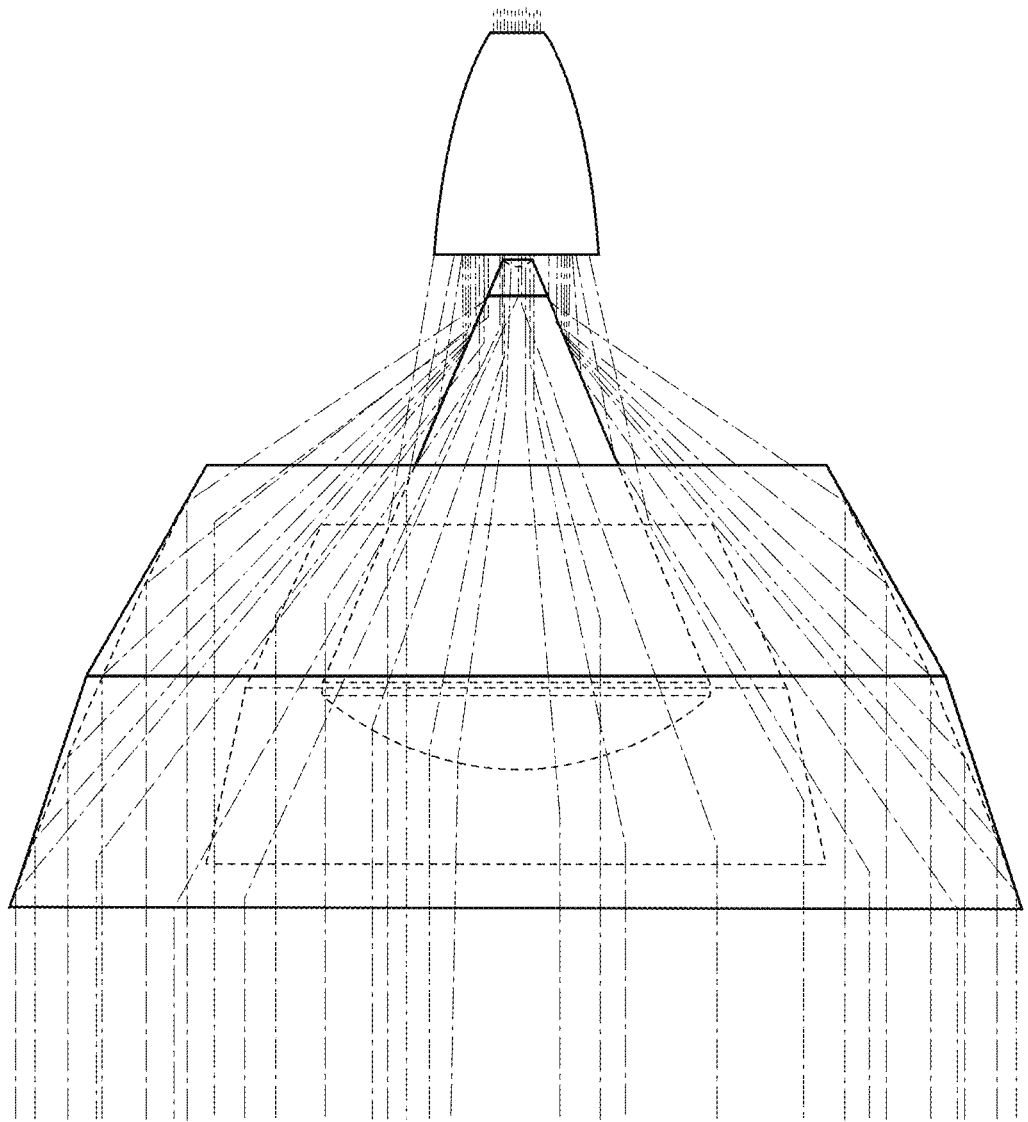
FIG. 9 is a ray trace of the lens of FIGS. 6-8.

FIGS. 6-8 depict a further embodiment of the light-concentrating lens assembly. This lens assembly includes two spherical and conical mirrors and one central lens to collect flux, namely an outer mirror (or reflective ring) 50 and an inner mirror (or reflective ring) 52. The lens assembly also includes one central reflective cone 54 to redirect (reflect) flux from the mirrors 50, 52. The lens assembly further includes an optional large lens (Zeonex lens) 55 at the front of the cone 54 and an optional small negative lens at the end of the cone to fill the exit aperture of the reflective cone 54 as best shown in FIG. 8. In other words, the small negative lens has a diameter substantially equal to the diameter of the exit aperture of the cone. Behind the cone 54 is a compound parabolic concentrator (CPC) or Winston cone 56. In the illustrated embodiment of FIG. 8, the outer diameter (OD) of the large (outer) mirror=104.4 mm, the exit diameter of CPC=5.0 mm, and the theoretical concentration=563×. As will be appreciated these dimensions are merely to illustrate the precise geometry of one specific embodiment and shall not be construed as the limiting the invention. In other words, the inventive concept may be applied to a lens assembly having different dimensions from those presented in FIG. 8. The two outer rings are concave and are mirrored only on the inside surface. In this particular embodiment, the cone that holds the zeonex lens and the negative lens is mirrored only the outside but not on the inside. This geometry guides the reflected light from the two spherical mirrors into the Winston cone. Additional spherical rings (additional spherical mirrors) may be added in other embodiments which may require increasing the diameter and length of the Winston cone and the length of the inside central reflective cone which is predicted to increase the amount of solar energy recovered. However, it is believed that the diameter of the zeonex lens cannot be substantially changed (in particular, increased) without degrading the overall system efficiency. As will be appreciated by those skilled in optics, the central cone 54 could have a reflective mirror geometry on its inside to guide light into the CPC 56 without the inclusion of a large zeonex lens 55 or the small negative lens 57 on or within the central reflective cone 54. In other variations of this embodiment, the large zeonex lens 55 could be included as illustrated in FIGS. 7-9 without the small negative lens 57.

This novel lens assembly does not necessarily need a specific focal point for it to work as it will produce a ray or beam of concentrated solar radiance from the end aperture (e.g. 5 mm aperture) of the Winston cone. However, the distance away from the beam has to be such that it will direct the energy to the collecting receiver within a relatively short distance from the tip (to ensure efficient energy capture).

This lens assembly may be used not only in a hybrid solar hydronic panel but in other solar or optical systems. The lens assembly is scalable to any dimension with a theoretically infinite number of mirrored rings.

The lens may be used to produce and concentrate solar energy for thermal or flux purposes for any number of applications. Other applications can also utilize its concentrated heat and/or concentrated photovoltaic directional capacity.

FIG. 9 depicts a ray trace showing that the lens assembly of FIGS. 6-8 has a 99.5% collection efficiency.

Figure 11:
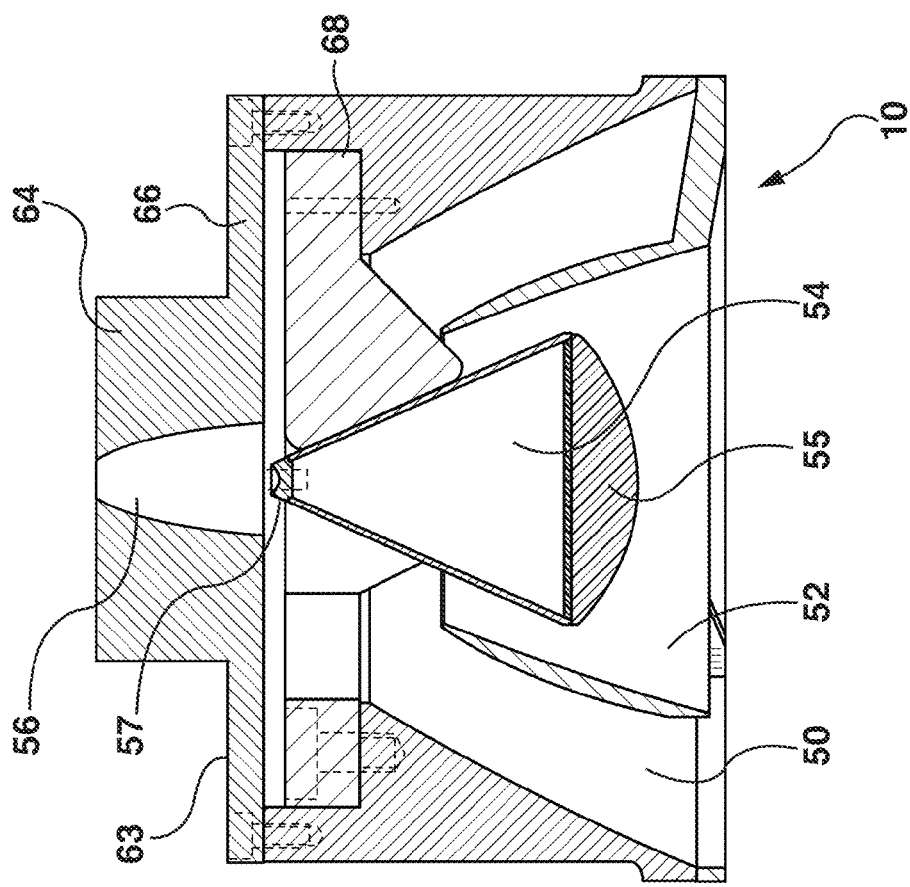
FIG. 11 is a cross-sectional view of the lens assembly of FIG. 10.
Figure 10:
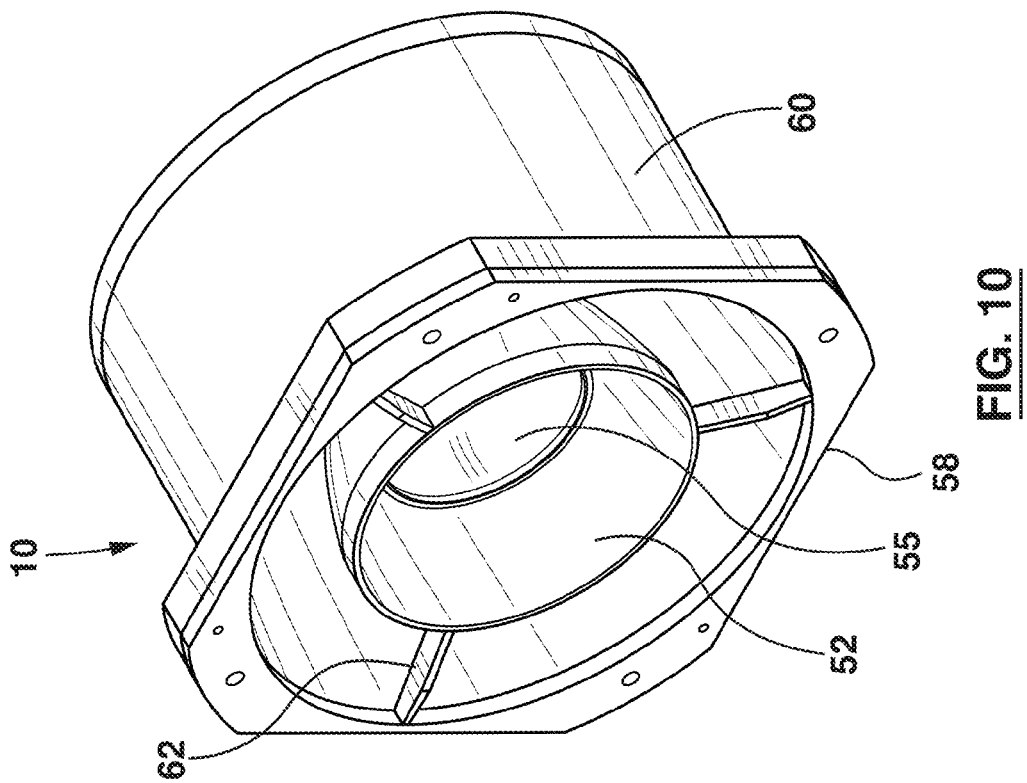
FIG. 10 is an isometric view of a lens assembly in accordance with another embodiment.

FIGS. 10-13 depict yet another embodiment of the lens assembly 10 which is an improved design over the others presented herein. As shown by way of example in these figures, the lens assembly has an outer mirrored ring 50 and an inner mirrored ring 52, a reflective cone 54 with an optional large lens 55 at the input aperture of the cone. The cone 54 has an optional small negative lens 57 at its exit aperture as shown in FIG. 11. Light is collected (by both reflection and refraction) by a compound parabolic concentrator (CPC) 56 aligned with the rings and cone along a central axis of the lens assembly. Accordingly, in one embodiment, the lens assembly has two concentrically arranged spherical and conical mirrors, a central reflective cone disposed along a central axis of the concentrically arranged spherical and conical mirrors to redirect flux from the mirrors and a compound paraboloid concentrator (CPC) disposed beneath the central reflective cone. Note in this embodiment that there is no large lens 55 and no small lens 57. In this embodiment, the central reflective cone may optionally have a highly reflective inner coating. In another embodiment, the lens assembly further includes a large central lens 55 at an inlet of the cone. In yet another embodiment, the lens assembly further comprises a small negative lens 57 at an outlet of the cone. In this latter embodiment, the central reflective cone may have a highly reflective outer coating.

This highly compact form is achieved by utilizing a catodioptric concentric ring reflector design and by concentrating the collected energy using the compound parabolic concentrator (CPC), also known as a Winston Cone. The non-imaging characteristics eliminate the need to precisely position the concentrator photovoltaic (CPV) cell relative to the lens assembly. Additional focal independence is enabled by utilizing an afocal lensed system which outputs the light collected from the central area of the input aperture to match the CPC exit aperture size.

The lens assembly 10 is capable of providing a 555× optical concentration at +/−0.5 degree input with up to 99.9% optical efficiency (collection efficiency) as illustrated in the FIG. 9 ray trace of FIGS. 6-7. In the specific lens assembly illustrated in FIGS. 10-13, the diameter is 106 mm and the exit aperture of the Winston cone is 4.5 mm. The overall depth of the illustrated lens assembly is 82.4 mm giving an equivalent focal ratio of 0.81. These dimensions are provided to illustrated one specific implementation and are not intended to be limiting. Persons of ordinary skill in the art will recognize that variations in these dimensions may still provide substantially similar results and performance.

Figure 13:
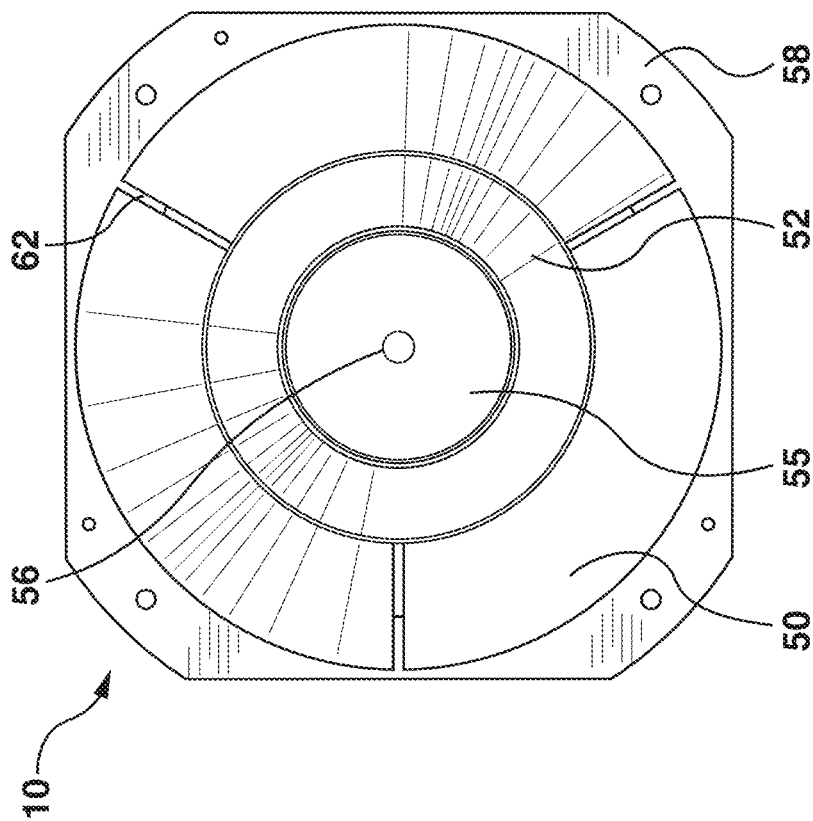
FIG. 13 is a front view of the lens assembly of FIG. 10.
Figure 12:
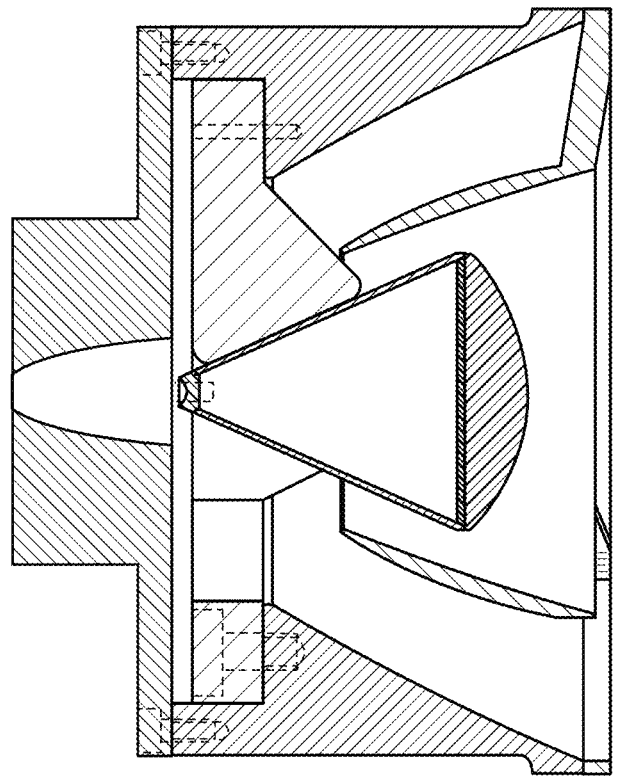
FIG. 12 is a cross-sectional view of the lens assembly of FIG. 10 with exemplary but non-limiting dimensions shown.

The lens assembly 10 of FIGS. 10-13 includes an outer housing 58, 60, 64. In the illustrated embodiment, the front portion of the outer housing has a square collar 58 with bevelled and rounded corners. The width and height of the square collar 58 of the housing is 110 mm in the illustrated embodiment although this dimension may be varied. The main body 60 of the housing has a stepped cylindrical shape as shown with a large diameter portion 60 followed by a smaller diameter portion 64 which retains the Winston cone 56. In the illustrated embodiment, the lens assembly includes a tri-arm holder 62 for holding the inner (central) ring 52 and a tri-arm holder 68 for holding the central cone 54. A rear cover plate 66 that includes the smaller diameter portion 64 of the housing may be fastened to the main cylindrical body 60 of the housing by threaded fasteners as shown or by any other suitable mechanical fastening means such as clips, pins, press-fit, interference-fit or snap-fit interconnections, adhesives, welding, soldering, or any suitable combination thereof. The rear cover plate 66 therefore defines an annular abutment surface 63 for being seated or installed in a holder, receptacle or socket as will be described in greater detail below. In the illustrated embodiment, the lens assembly further includes an internal retainer 68 which retains the cone 54, inner ring 50, and outer ring 52. FIG. 13 illustrates how the lens 55 is concentric to the CPC 56 and how the rings 50, 52 are concentric as well. As will be appreciated by those skilled and experienced in manufacturing, slight modifications and improvements in the lens assembly's 10 outer casing 58,60,63,64,66 and internal tri-arm holders 62 and 68 design may occur for improved cost containment and lens and production efficiencies.

A variant of the embodiment illustrated in FIGS. 6 to 8 has a 122 mm diameter three-ring reflector design that can provide 735× concentration at +/−1-0.5 degrees with 99.9% design optical efficiency. The overall depth increases to 91 mm, giving an equivalent focal ratio of 0.75. It is noted that the design may be scaled up to collect increasing amounts of solar energy by utilizing additional ring structures. While there is no theoretical upper limit in the extending the input aperture size, the cost of adding and aligning additional rings becomes counterproductive. More importantly, the parts have non-zero wall thicknesses, which means that as the number of rings increases the optical efficiency may decrease.

In the embodiments illustrated, a depth of the lens assembly is less than a width of the lens assembly. As shown for example in FIG. 11, the depth (measured from the input plane of the inner ring to the exit aperture of the CPC) is less than the width or diameter of the housing (less than an outer diameter of the outer ring).

The lens assembly 10 may be integrated into a solar energy system having a heat exchanger, which is herein referred to as a hybrid solar energy recovery system since it generates electric power by photovoltaic cells and also directly heats water or other fluid in a heat exchanger. The heat exchanger also functions to cool the CPV cells to improve their performance.

One such heat exchanger is partially depicted by way of example in FIG. 14. The heat exchanger coil, loop or conduit 70 has an intake pipe and an outlet pipe. Although five parallel segments or passes are illustrated in FIG. 14, the number of segments or passes may be varied. On each segment or pass, there is a flattened portion 72 for receiving eight photovoltaic (CPV) cells 74 mounted or supported by the flattened portion 72 of the heat exchanger although a different number may be used. This provides for a total of forty CPV cells 74 in this particular embodiment. The number of CPV cells per pass, the number of passes and the total number of CPV cells may vary in other variants. Above each CPV cell is a respective lens assembly 10 for concentrating light on the respective CPV cell, for a total of forty lens assemblies in this particular embodiment.

Figure 15:
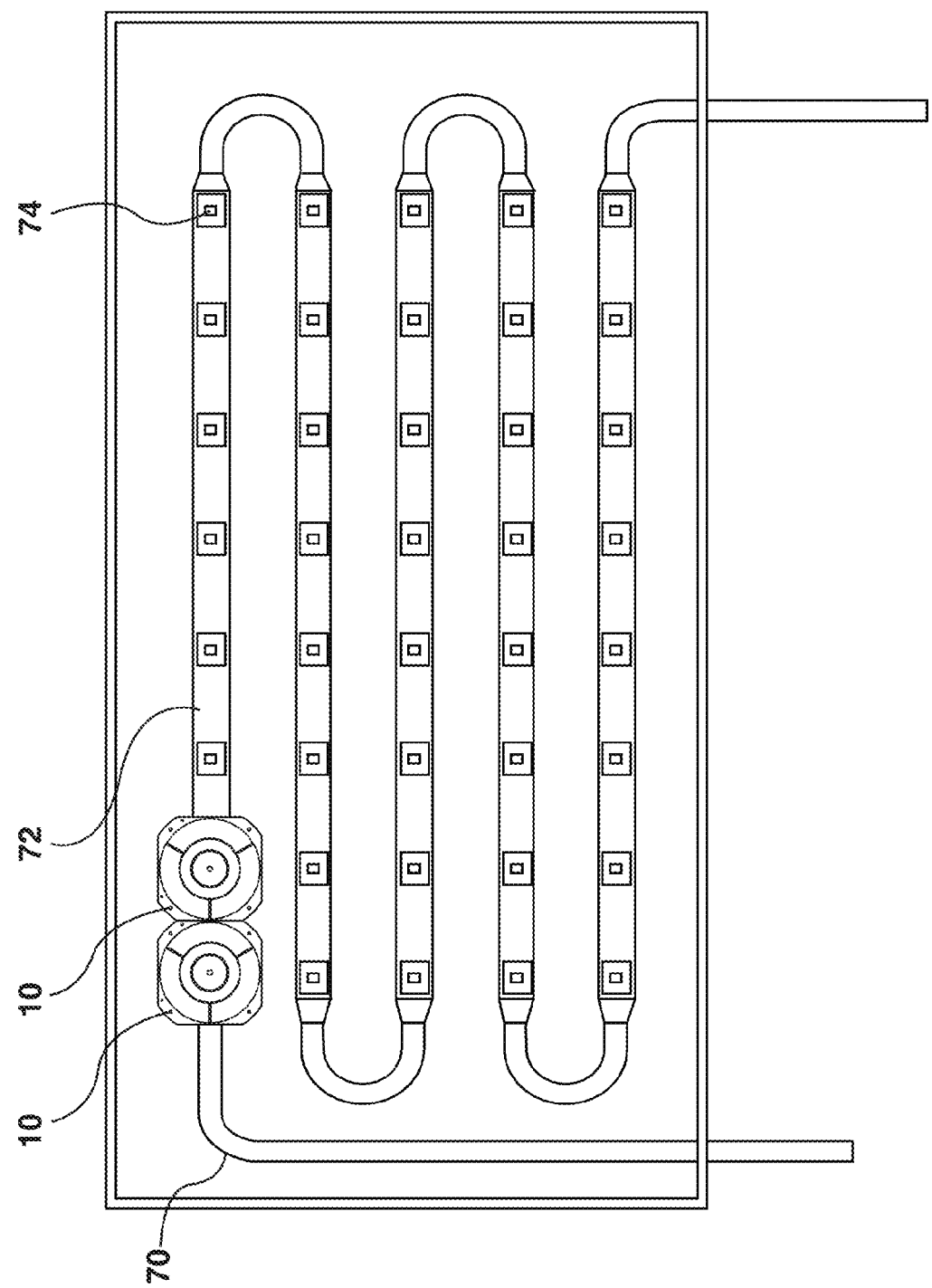
FIG. 15 depicts two lenses disposed on the heat exchanger of FIG. 14.

FIG. 15 shows how two lens assemblies 10 are mounted in alignment with two CPV cells 74 which in this embodiment are Advanced Quantum Dot Enhanced High Efficiency Concentrator Photovoltaic (CPV) cells along the first pass of the loop/coil. These lens assemblies 10 may be mounted flush (by virtue of the square collar 58) with its neighbouring or adjacent lens assembly or assemblies as shown in FIG. 15.

Figure 16:
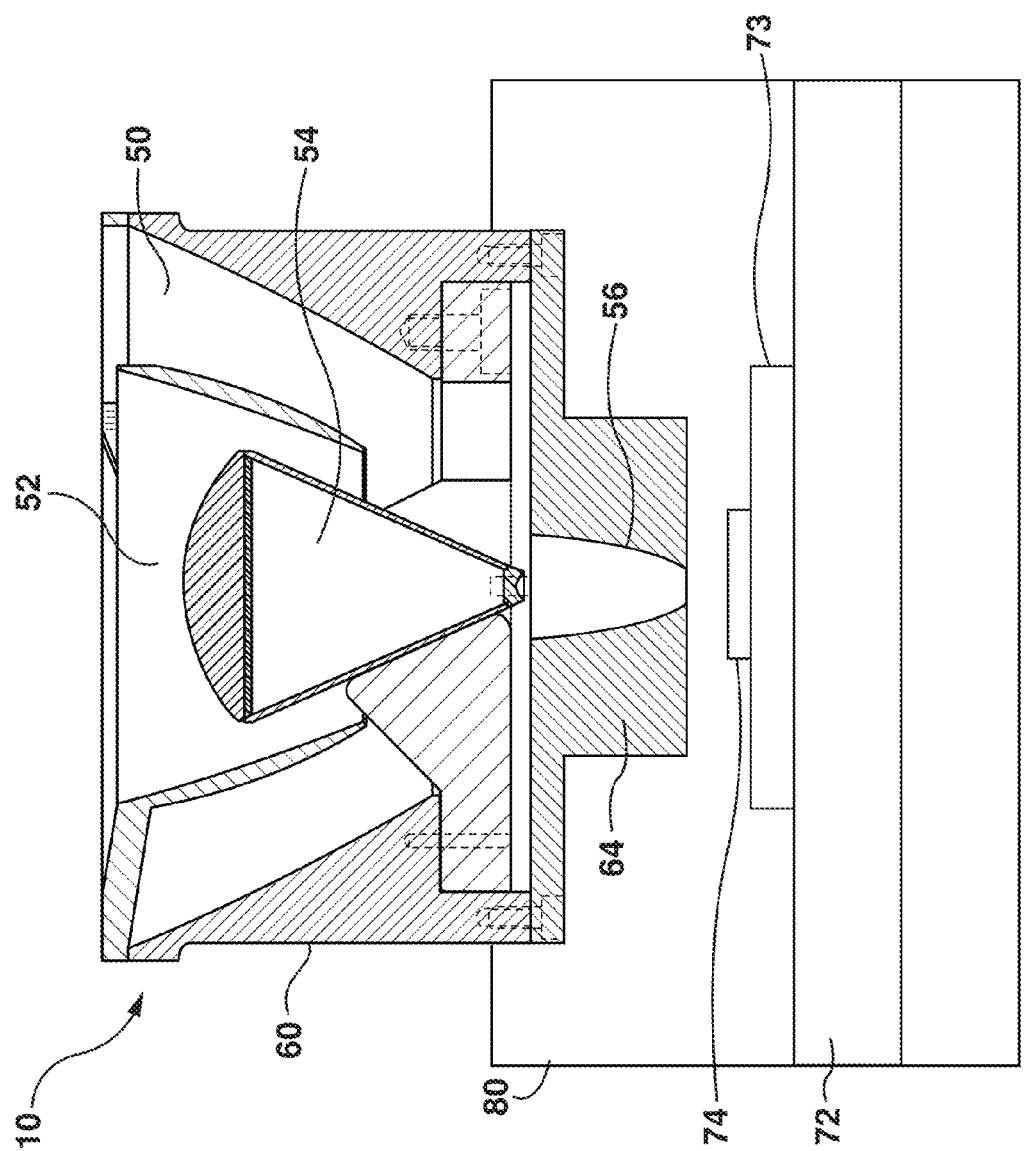
FIG. 16 is a cross-sectional view of the lens mounted above the heat exchanger.

As shown by way of example in FIG. 16, each lens assembly 10 is mounted in a spaced-apart arrangement relative to its respective CPV cell 74. There is a gap or space between the exit aperture of the Winston cone 56 and the CPV cell 74 as shown in FIG. 16. The CPV cell 74 may be mounted on a very conductive adhesive compound or on a pedestal, support bracket, holder or mounting fixture 73 which is mounted to the flattened portion 72 of the heat exchanger conduit 70.

As shown in FIG. 16, the housing of the lens assembly suspends securely just above the CPV cell 74 held in place from a mounting bracket or array assembly holder (which is not illustrated in FIG. 16) which results in a space 80 that permits concentrated light exiting the CPC 56 to fully and completely ("uninhibitedly") discharge upon the CPV cell 74 to thereby augment the light energy delivered to the CPV cell. In other words, there is free space 80 between the heat exchanger unit, the CPV's and the lens assembly. The CPV cells are connected via wires or other electrical conductors, either in series or parallel, to a power storage device such as a battery, capacitor or equivalent energy storing means and/or directly to a power-consuming device such as an appliance, light, motor, etc., and/or delivered back to the electrical grid.

Figure 17:
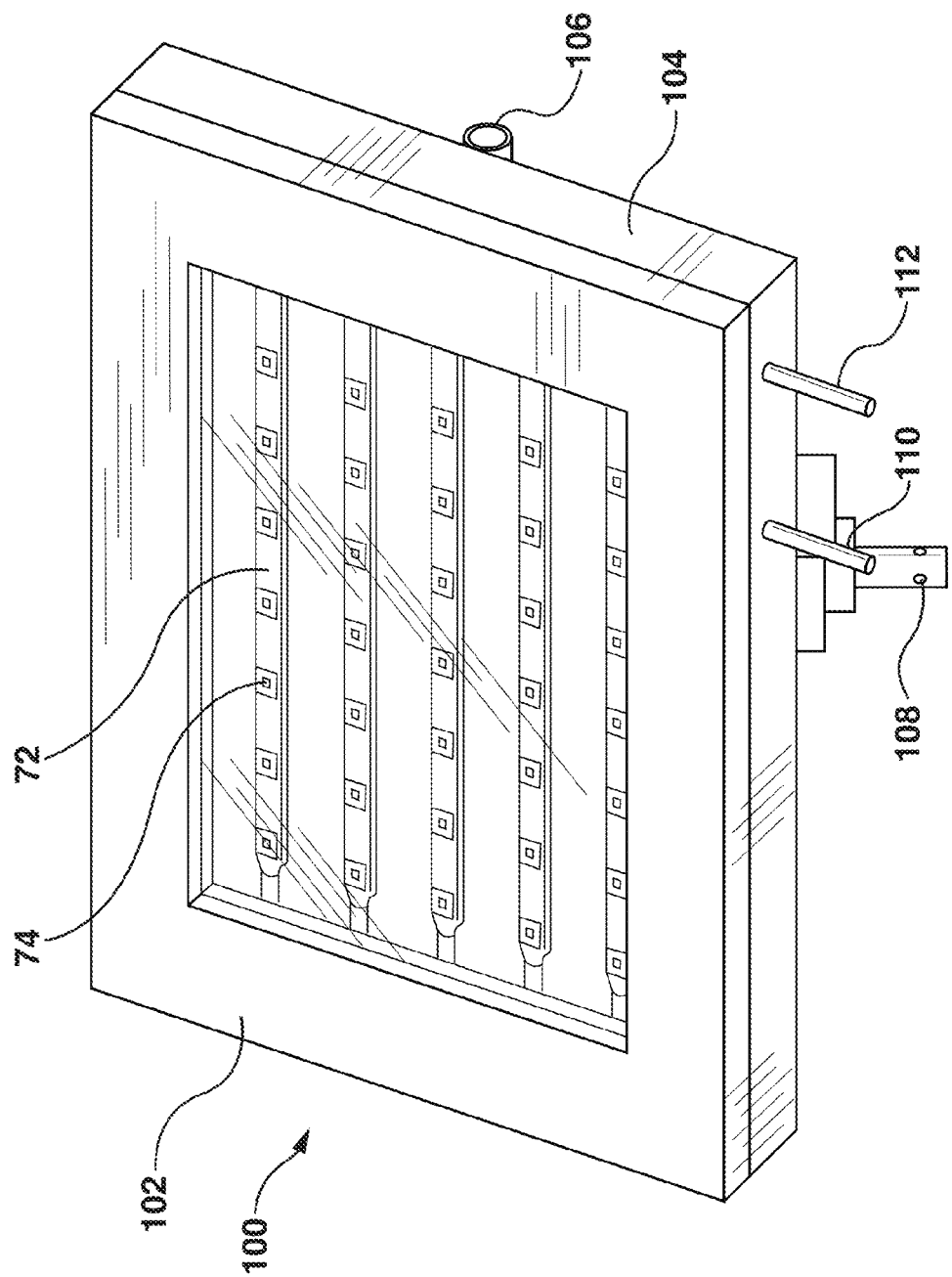
FIG. 17 is a front isometric view of a solar panel incorporating a variant of the heat exchanger of FIG. 14.

FIG. 17 depicts a solar panel (or panel assembly) 100 which incorporates a variant of the heat exchanger shown in FIG. 14. The solar panel 100 includes a lens plate 102 and a base plate or frame 104. The frame 104 has pivot mounts 106 for rotating the panel about a first axis, e.g. a generally horizontal axis. A post, shaft or axle 108 permits rotation about a second axis, e.g. a generally vertical axis. However, the panel may be installed in different orientations. The lens plate has a transparent pane or window to allow light to reach the heat exchanger and CPV cells 74 which are disposed along the flattened portion 74 of the conduit of the heat exchanger. It is to be noted that the light-concentrating lens assemblies 10 are not illustrated in FIG. 17 and that a fully functioning solar panel 100 would require the light-concentrating lens assemblies 10 to be installed. Water or other heat-transferring fluid enters the heat exchanger at inlet 110 and leaves via outlet 112.

Figure 18:
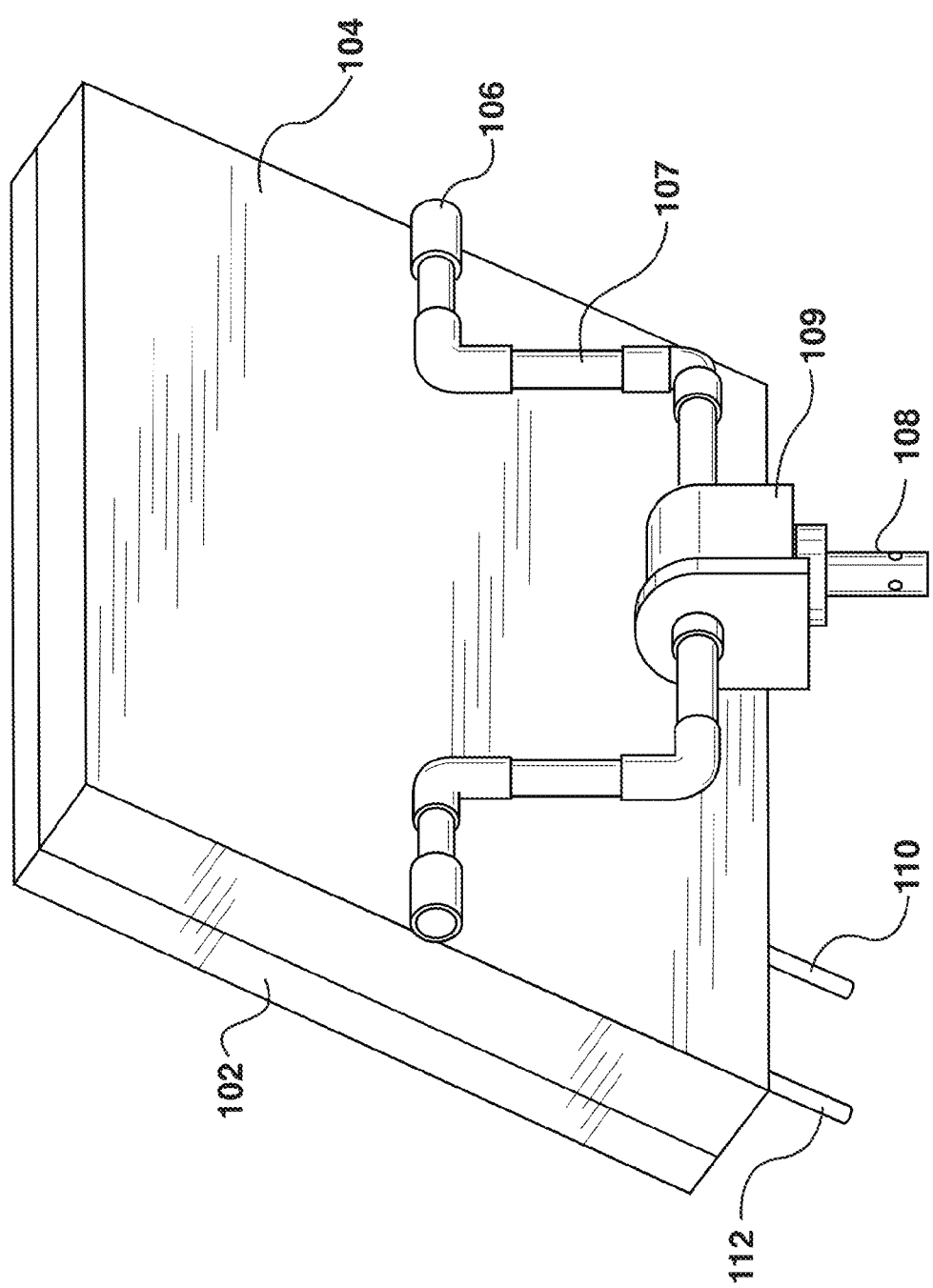
FIG. 18 is a rear isometric view of the solar panel of FIG. 17.

FIG. 18 shows the rear of the panel. The pivot mounts 106 attached to the back cover or frame 104 rotationally receive a U-shaped pivot arm subassembly 107 driven by a motor 109 to provide pitch. The motor may also rotate the panel about the axle 108 to provide yaw. The pitch and yaw enable the panel to track the arcuate path of the sun to maintain the panel perpendicular to the sun to optimize collection efficiency.

Figure 19:
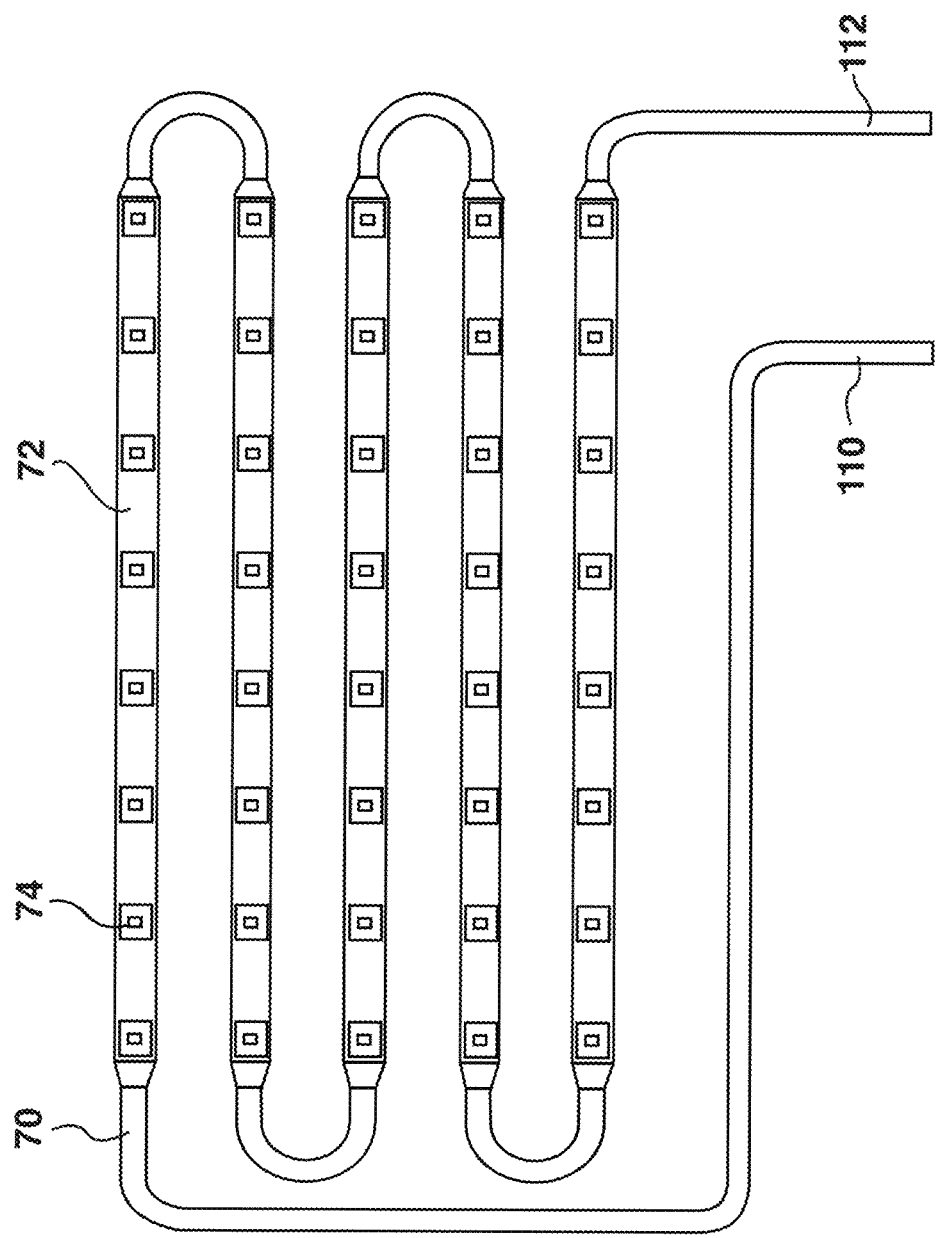
FIG. 19 is top plan view of a variant of the heat exchanger of FIG. 14 configured for use in the solar panel of FIG. 17.

The heat exchanger as shown in FIG. 19 has a conduit 70, flattened portion 72 and a plurality of CPV's 74 disposed along the flattened portion of the conduit although other arrangements or configurations are possible.

Figure 20:
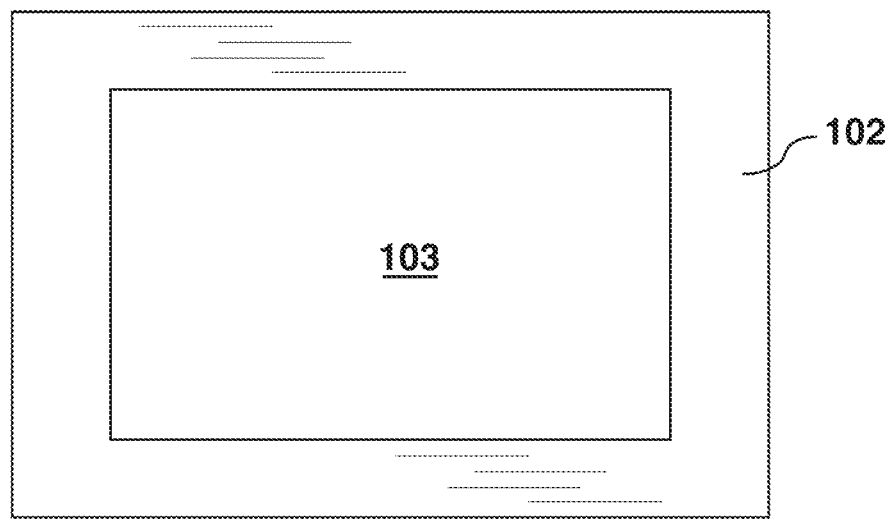
FIG. 20 is a top plan view of a lens plate for the solar panel of FIG. 17.
Figure 21:
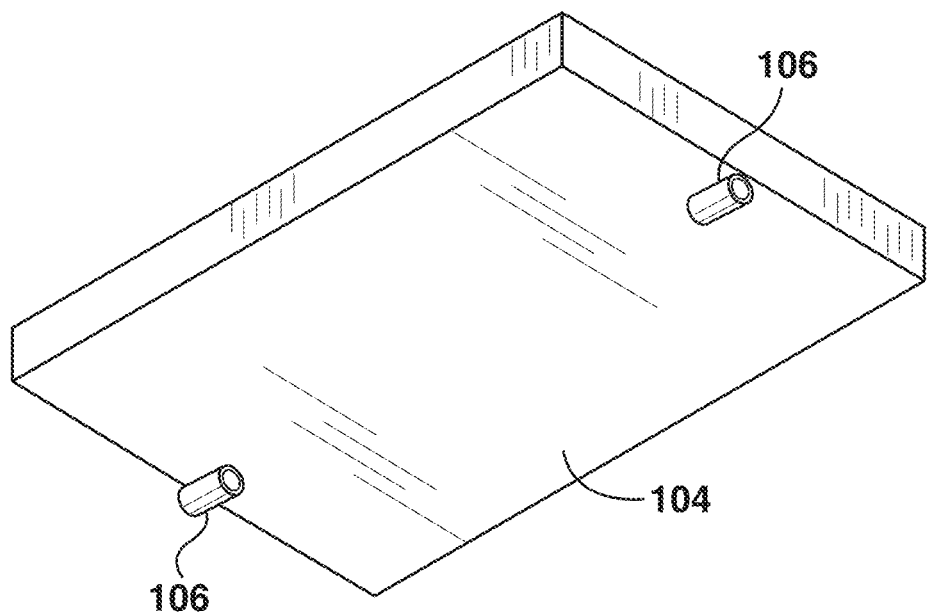
FIG. 21 is a rear isometric view of the base plate or frame of the solar panel of FIG. 17.

The lens plate 102 as shown in FIG. 20 has a generally rectangular frame-like structure surrounding a central or inner rectangular opening that houses the window or pane 103 which may be made of glass or other transparent or translucent material.

The back cover or frame 104 has two pivot mounts 106 that are spaced-apart to receive the U-shaped pivot arm subassembly. The pivot mounts may be, or may include, journals, bushings, bearings, sockets or any other suitable rotational housing.

This new technology has been described in terms of specific implementations and configurations which are intended to be exemplary only. Persons of ordinary skill in the art will appreciate that many obvious variations, refinements and modifications may be made without departing from the inventive concepts presented in this application. The scope of the exclusive right sought by the Applicant(s) is therefore intended to be limited solely by the appended claims.

The invention claimed is:

1. A light-concentrating lens assembly for a solar energy system, the assembly comprising:
    a plurality of concentrically arranged paraboloid mirror reflectors;
    a conical light guide extending below the plurality of paraboloid mirror reflectors;
    a reflective inner central cone disposed along a central axis of the concentrically arranged paraboloid mirror reflectors; and
    a compound paraboloid concentrator disposed beneath the inner central cone.

2. The light-concentrating lens assembly as claimed in claim 1 wherein the conical light guide extends from a bottom of a most radially outward reflector to an upper periphery of the compound paraboloid concentrator.

3. The light-concentrating lens assembly as claimed in claim 2 wherein a ratio of a base diameter of the inner cone to a diameter of the top glass plate is 1 to 7.6.

4. The light-concentrating lens assembly as claimed in claim 2 wherein a ratio of a base diameter of the inner cone to a diameter of the top glass plate ranges between 1:7 and 1:8.

5. The light-concentrating lens assembly as claimed in claim 1 comprising a top glass plate disposed on top of the plurality of concentrically arranged paraboloid mirror reflectors.

6. The light-concentrating lens assembly as claimed in claim 5 wherein a thickness of the top glass plate is substantially equal to a thickness of each reflector.

7. The light-concentrating lens assembly as claimed in claim 5 wherein a thickness of the top glass plate is equal to 90-110% of a thickness of each reflector.

8. The light-concentrating lens assembly as claimed in claim 1 wherein a gap between successive paraboloid mirror reflectors is greater than a thickness of each of the paraboloid mirrors reflectors.

9. The light-concentrating lens assembly as claimed in claim 1 wherein a ratio of a gap between successive paraboloid mirror reflectors to a thickness of each of the paraboloid mirror reflectors is between 1 and 2.

10. The light-concentrating lens assembly as claimed in claim 1 wherein the inner cone is longer than the compound paraboloid concentrator.

11. The light-concentrating lens assembly as claimed in claim 10 wherein the inner cone has a base diameter equal to that of the compound paraboloid concentrator.

12. The light-concentrating lens assembly as claimed in claim 1 wherein the compound paraboloid concentrator has a length equal to its base diameter.

13. The light-concentrating lens assembly as claimed in claim 1 wherein the inner cone has a length to base diameter ratio of 8 to 5.

14. The light-concentrating lens assembly as claimed in claim 1 wherein each reflector has a lens profile characterized by:
- a lower curved lens portion having an upwardly facing convex surface and a downwardly facing concave surface; and
- an upper curved upper lens portion having a radially outward convex surface and a radially inward concave surface.

15. The light-concentrating lens assembly as claimed in claim 14 wherein the upper curved lens portion terminates in an upper circular edge.

16. The light-concentrating lens assembly as claimed in claim 15 wherein a spacing between each successive upper circular edge is equal to three times a thickness of each reflector.

17. The light-concentrating lens assembly as claimed in claim 15 wherein a spacing between each successive upper circular edge ranges from two to four times a thickness of each reflector.

18. The light-concentrating lens assembly as claimed in claim 1 wherein the inner central cone has a highly reflective inner coating.

19. A light-concentrating lens assembly for a solar energy system, the assembly comprising:
- two concentrically arranged spherical and conical mirrors;
- a central reflective cone disposed along a central axis of the concentrically arranged spherical and conical mirrors to redirect flux from the mirrors; and
- a compound paraboloid concentrator (CPC) disposed beneath the central reflective cone.

20. The lens assembly as claimed in claim 19 further comprising a large central lens at an inlet of the cone.

21. The lens assembly as claimed in claim 20 further comprising a small negative lens at an outlet of the cone.

22. The lens assembly as claimed in claim 19 wherein a depth of the lens assembly is less than a width of the lens assembly.

23. The lens assembly as claimed in claim 19 wherein the central reflective cone has a highly reflective inner coating.

24. The light-concentrating lens assembly as claimed in claim 21 wherein the central reflective cone has a highly reflective outer coating.

* * * * *